United States Patent [19]

Weng

[11] Patent Number: 4,975,867
[45] Date of Patent: Dec. 4, 1990

[54] APPARATUS FOR DIVIDING ELEMENTS OF A GALOIS FIELD GF ($2^{2M}$)

[75] Inventor: Lih-Jyh Weng, Lexington, Mass.

[73] Assignee: Digital Equipment Corporation, Maynard, Mass.

[21] Appl. No.: 67,712

[22] Filed: Jun. 26, 1987

[51] Int. Cl.$^5$ .............................................. G06F 7/52
[52] U.S. Cl. ................................................ 364/746.1
[58] Field of Search ...................... 364/761, 765, 746.1; 371/37

[56] References Cited

U.S. PATENT DOCUMENTS

| 4,473,887 | 9/1984 | Odaka ................................. 364/761 |
| 4,567,568 | 1/1986 | Inagawa et al. ..................... 364/761 |
| 4,574,361 | 3/1986 | Inagawa et al. ..................... 364/761 |
| 4,800,515 | 1/1989 | Hori et al. .......................... 364/746.1 |

OTHER PUBLICATIONS

Wang et al., "VLSI Architectures for Computing Multiplications and Inverses in GF ($2^m$)", *IEEE Trans. on Computers*, vol. C-34, No. 8, 1985, pp. 709-717.

Primary Examiner—David H. Malzahn
Attorney, Agent, or Firm—Nutter, McClennen & Fish

[57] ABSTRACT

The invention is an apparatus and/or method which enables one to divide two elements, A and B, of GF($2^{2M}$), that is, perform the operation B/A, by finding the multiplicative inverse of the divisor A, and then multiplying the inverse by the numerator, B. The multiplicative inverse, $A^{-1}$, of A is found by computing a conversion factor, D, and then multiplying A by D to convert it to an element C, where C is also an element of a smaller Galois Field, GF($2^M$), which is a subfield of GF($2^{2M}$). Specifically, C is equal to $A^{2M+1}$, or $A^{2M}*A$, in the field GF($2^{2M}$). Next, the multiplicative inverse, $C^{-1}$, of C in GF($2^M$) is found by appropriately entering a stored look-up table containing the $2^M$ elements of GF($2^M$).

The multiplicative inverse, $C^{-1}$, of C is thereafter converted, by multiplying it by the conversion factor D calculated above, to the element of GF($2^{2M}$) which is the multiplicative inverse, $A^{-1}$, of the original divisor, A. The multiplicative inverse, $A^{-1}$, of A is then multiplied by B to calculate the quotient, B/A.

12 Claims, 2 Drawing Sheets

APPARATUS FOR DIVIDING ELEMENTS OF A GALOIS FIELD GF ($2^{QM}$)

FIELD OF THE INVENTION

This invention relates to data error correction decoding, data encryption and decryption mechanisms and signal processing systems and more particularly to such systems which employ Galois Field division operations.

DESCRIPTION OF PRIOR ART

The importance of error correction coding of data in digital computer systems has increased greatly as the density of the data recorded on mass storage media, more particularly magnetic disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is recorded on a disk, it is mathematically encoded to form ECC symbols. The ECC symbols are then appended to the data string to form code words—data symbols plus ECC symbols—and the code words are then stored on the disk. When the stored data is to be accessed from the disk, the code words containing the data symbols are retrieved from the disk and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, *Error Correction Codes*]. Error detection and correction techniques for Reed-Solomon ECC's are well known. Id. One such technique begins with again encoding the code word data to generate ECC symbols and then comparing these ECC symbols with the ECC symbols in the code word, i.e. the ECC symbols generated by the pre-storage encoding of the data, to detect any errors in the retrieved data. [For a detailed discussion of this error detection technique, see U.S. Pat. 4,413,339 issued to Riggle and Weng].

If errors are detected in the retrieved data, Galois Field division is usually one of the necessary operations performed in correcting the errors. Galois Field division is a time consuming operation which significantly lengthens the ECC decoding process. The time it takes to perform error correction adversely affects the rate at which data can be retrieved from a storage device.

As the potential for errors in stored data increases with the use of higher recording densities, the effect of slow error correction has a material effect on the average speed with which the data can be retrieved. The increased data retrieval time in turn limits the speed of all computer applications that require the retrieval of the stored data. This speed limitation occurs at a time when computer system technology advances have otherwise made possible faster data transfer operations. Thus, there is a need for a faster apparatus to perform Galois Field division, which will effectively speed up ECC decoding. Such a method would allow computer systems to take advantage of the faster data transfer rates possible with advances in the state of the art computer technology.

The importance of data encryption has increased as the use of computer communications systems, more particularly communication systems involving the transfer of data over telephone lines, has increased. One important encryption method involves encoding the data over a Galois Field. Encrypting the data and later decrypting the data involves division over the Galois Field. The speed with which data can be encrypted and decrypted directly affects the speed with which data can be transferred and processed.

Recently, Galois Fields have been employed in computer controlled signal processing. Specifically, the mathematical transformations of the signal required in signal processing are now often performed over Galois Fields so that the properties of finite, cyclic fields can be utilized. The manipulation of the signal transformations requires Galois Field division. Also, the use of Galois Field operations in data compression and data expansion apparatus is under development. Any such apparatus will perform division over a Galois Field. Thus the speed with which data operations can be performed in either signal processing apparatus or data compression and/or expansion apparatus is significantly affected by the speed with which Galois Field division can be performed.

SUMMARY OF THE INVENTION

The invention enables one to divide two elements, A and B, of GF($2^{2M}$), that is, perform the operation B/A, by quickly finding the multiplicative inverse of the divisor A, and then multiplying the inverse by the numerator, B. The multiplicative inverse, $A^{-1}$, of A is found by computing a conversion factor, D, and then multiplying A by D to convert it to an element C, where C is also an element of a smaller Galois Field, GF($2^M$), which is a subfield of GF($2^{2M}$). Specifically, C is equal to $A^{2M+1}$, or $A^{2M}*A$, in the field FG($2^{2M}$). Next, the multiplicative inverse, $C^{-1}$, of C in GF($2^M$) is found quickly by appropriately entering a stored look-up table containing the $2^M$ elements of GF($2^M$).

The multiplicative inverse, $C^{-1}$, of C is then converted, by multiplying it by the conversion factor D calculated above, to the element of GF($2^{2M}$) which is the multiplicative inverse, $A^{-1}$, of the original divisor, A. The multiplicative inverse, $A^{-1}$, of A is then multiplied by B to calculate the quotient, B/A.

In a Galois Field of characteristic two, the operation of raising an element to a power $2^i$, that is, computing $A^{2^i}$ has the same degree of simplicity as the multiplication operation. Thus, while five operations, that is, calculating the conversion factor D; computing C; entering the $2^M$ look-up table to retrieve $C^{-1}$; multiplying $C^{-1}$ by the conversion factor D to produce $A^{-1}$; and multiplying $B*A^{-1}$, are involved in computing the quotient, B/A, the new division process is faster than conventional Galois Field division. Conventional Galois Field division requires that the multiplicative inverse of the divisor, A, be found in the larger $2^{2M}$ element Galois Field. If a look-up table is used, the table will contain $2^{2M}$ elements. Finding a multiplicative inverse in the larger table is significantly slower then performing the same operation in the smaller field.

In the more general case of GF($2^{QM}$), the conversion factor D is equal to $$A^{[2(Q-1)M + 2(Q-2)M + \ldots + 2M]}.$$

Thus the element C, which is A*D, is equal to $$A^{[2(Q-1)M+2(Q-2)M+\ldots+2M+1]}$$

and the new division process requires Q+3 operations, that is, Q operations for calculating the conversion factor D and computing C and three operations for retrieving $C^{-1}$ from the $2^M$ element look-up table and calculating $A^{-1}$ and $B*A^{-1}$. By a proper choice of the factors, Q and M, of the exponent of $GF(2^{QM})$, it is possible to obtain a best or an optimum implementation of the new division process. For example, if the exponent of the field is 12, there are several choices for the factors Q and M. One set of factors will be chosen for the new division process, depending on the speed with which the Q+3 operations can be performed and the speed with which a $2^M$ look-up table can be entered. However, the new division process, with its Q+3 operations, is still faster than conventional Galois Field division operations.

BRIEF DESCRIPTION OF THE DRAWINGS

The invention will be pointed out with particularity in the appended claims. The above and other advantages of the invention may be better understood by referring to the following description taken in conjunction with the accompanying drawings, in which:

DETAILED DESCRIPTION

It should be understood that all addition and multiplication operations performed during the new division process are Galois Field operations.

Figure 1:
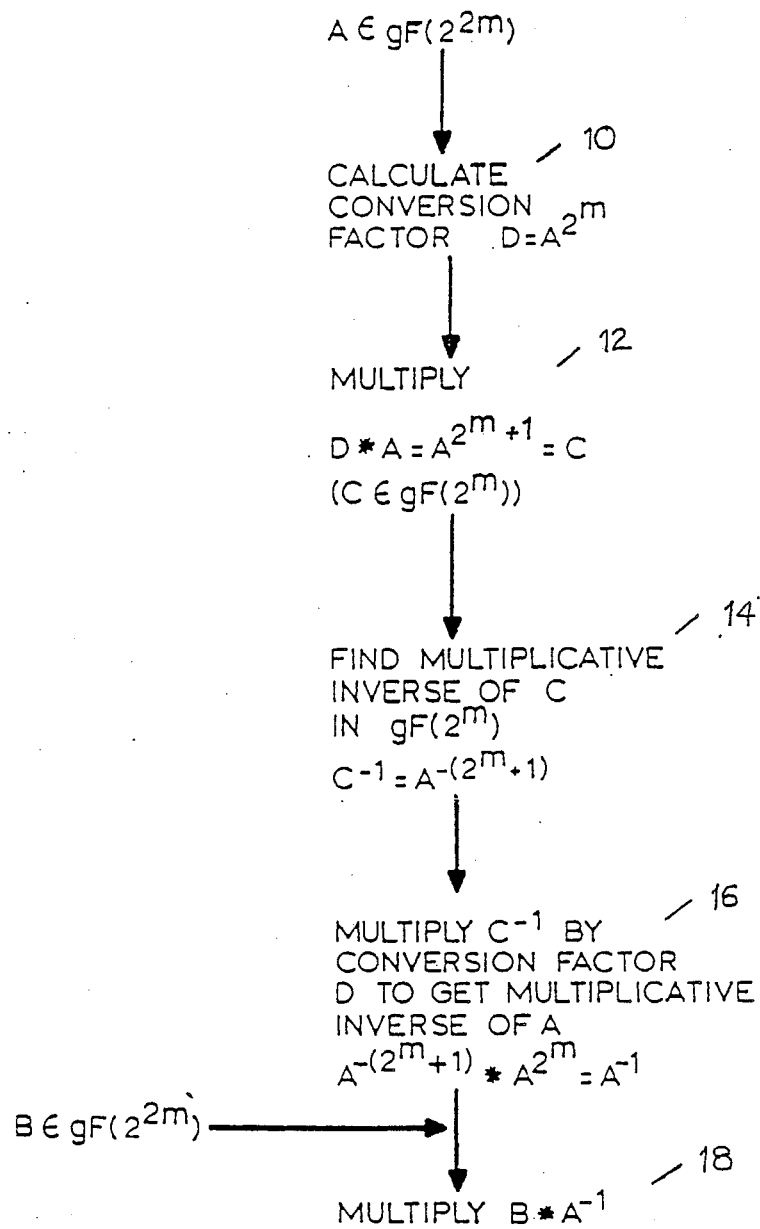
FIG. 1 is a flow chart of the steps involved in the operation of the preferred embodiment.
Figure 2:
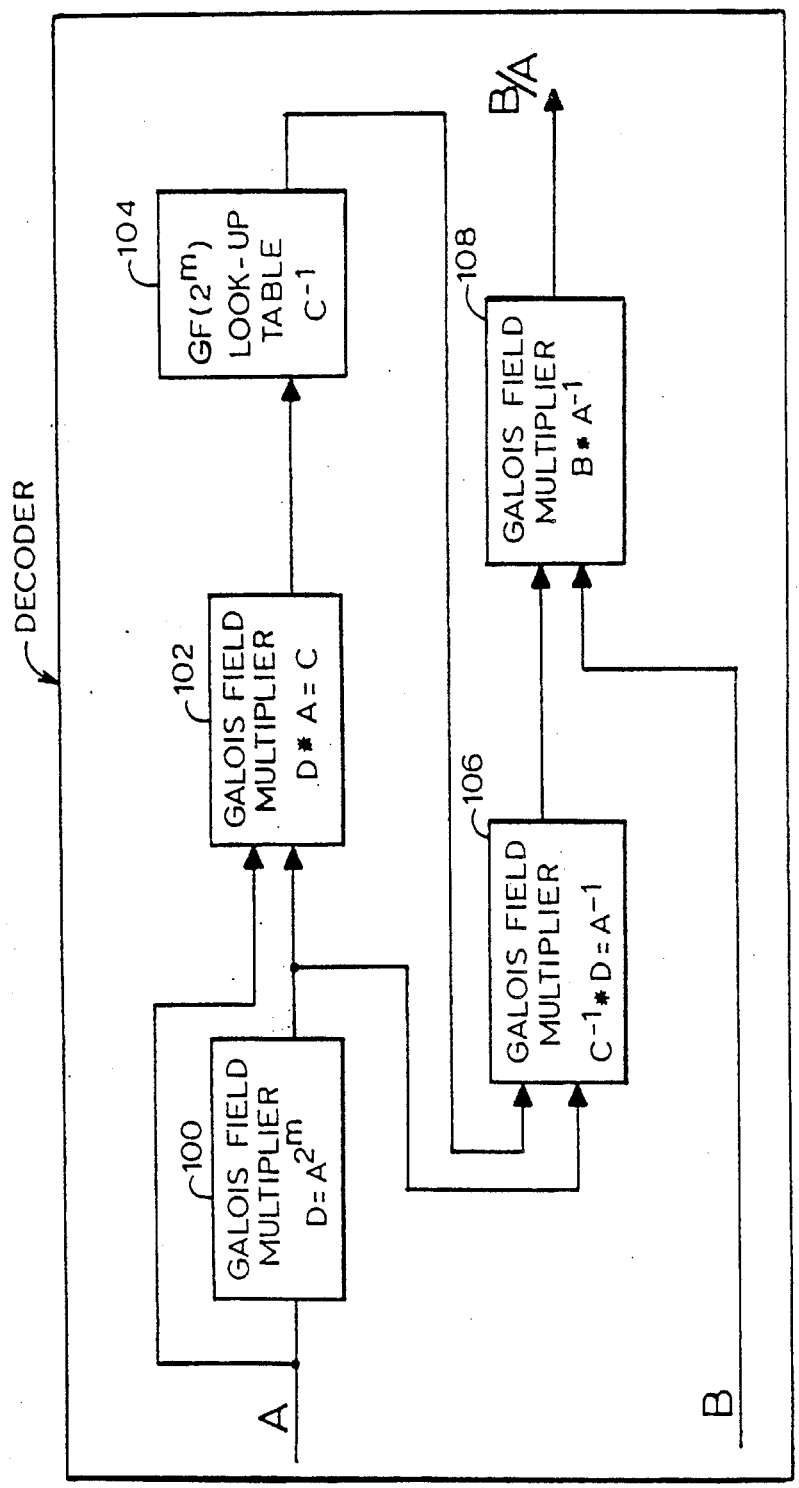
FIG. 2 is a functional block diagram of a decoder including means for determining the quotient B/A constructed in accordance with the invention.

With reference to FIGS. 1 and 2, the new Galois Field division process is performed as part of an encoding or decoding process, where the encoding and/or decoding can be for error correction, data encryption or decryption or signal processing. The Galois Field division is performed by first converting the divisor, A, which is a non-zero element of $GF(2^{2M})$, to an element, C, which is also an element of a smaller Galois Field $GF(2^M)$ (Steps 10-12). The conversion is accomplished by first calculating a conversion factor, D, which is equal to:

$$A^{2M}$$

(Step 10) in a Galois Field calculator 100. Calculating $A^{2M}$ in a Galois Field of characteristic two is a relatively simple operation.

Next, the conversion factor, D, is multiplied by A (Step 12) in a Galois Field multiplier 102 to produce C:

$$A^{2M}*A = A^{2M+1} = C$$

where $A^{2M+1}$ is an element of the smaller field $GF(2^M)$. Thus for every A which is an element of $GF(2^{2M})$, there is an element C which is also an element of $GF(2^M)$. In general, for any Galois Field $GF(2^{QM})$, that is, a Galois Field characterized in part by an exponent, QM, which can be factored, there exists a subfield $GF(2^M)$.

Next the multiplicative inverse, $C^{-1}$, of C is determined (Step 14) by entering a look-up table 104 consisting of the $2^M$ elements in $GF(2^M)$. The look-up table 104 is entered according to the value of element C, and the unique multiplicative inverse, $C^{-1}$ of C in $GF(2^M)$, which can be written in the form $$A^{-[2M+1]}$$

is retrieved from the table.

The multiplicative inverse, $C^{-1}$, of C in $GF(2^M)$ is then multiplied by the conversion factor, D, which was calculated earlier in converting A to C, in a Galois Field multiplier 106 (Step 16) to convert it to the element of $GF(2^{2M})$ which is the multiplicative inverse, $A^{-1}$, of A:

$$A^{-[2M+1]}*A^{[2M]} = A^{-1}$$

The quotient B/A can then be readily obtained by multiplying $B*A^{-1}$ (Step 18) in a Galois Field multiplier 108.

The size of the look-up table used in the new division process is $2^M$ elements. If, for example, the larger Galois Field is $GF(2^{10})$, that is, $GF(2^{(2*5)})$ the look-up table will have only $2^5$ or 32 elements. The multiplicative inverse can be quickly obtained from a 32-element table.

Conventional Galois Field division requires selecting the multiplicative inverse of the divisor, A, from a $2^{2M}$ element table. Using $GF(2^{10})$, the look-up table would have $2^{10}$ or 1024 elements. Finding the multiplicative inverse in this $2^{2M}$ element table is materially slower than using the $2^M$ element look-up table.

The foregoing description is limited to a specific embodiment of this invention. It will be apparent, however, that this invention can be practiced in systems having diverse basic construction or using different internal circuitry than is described in the specification with the attainment of some or all of the advantages of this invention. Therefore, it is the object of the appended claims to cover all such variations as come within the true spirit and scope of this invention.

What is claimed as new and desired to be secured by Letters Patent of the United States is:

1. An encoding apparatus containing means for computing the quotient, B/A, of two elements of Galois Field $FG(2^{QM})$, said apparatus comprising:
   A. means for converting the divisor, A, into an element C of $GF(2^{QM})$, where C is $A^P$ and P equals $2^{(Q-1)m} + 2^{(Q-2)M} + \ldots + 2^M + 1$, the element C being also an element of a smaller Galois Field $GF(2^M)$ which is a sub-field of $GF(2^{QM})$;
   B. means for finding the multiplicative inverse, $C^{-1}$, of the element C in the smaller Galois Field $GF(2^M)$;
   C. means for converting the multiplicative inverse, $C^{-1}$, into an element of $GF(2^{QM})$ which is the multiplicative inverse, $A-1$, of A by multiplying $C^{-1}$ by $A^S$ where S equals $2^{(Q-1)M} + 2^{3(Q-2)M} + \ldots + 2^M$; and
   D. means for multiplying the element B by the multiplicative inverse $A^{-1}$.

2. The apparatus recited in claim 1 wherein said means for calculating C comprises:
   A. means for calculating a conversion factor of the form $A^S$; and
   B. means for multiplying said conversion factor by the element A.

3. The apparatus recited in claim 1 wherein said means for finding the multiplicative inverse, $C^{-1}$, further includes the use of a look-up table consisting of all $[2^M]$elements of $GF(2^M)$.

4. The apparatus of claim 1 wherein said means for converting the multiplicative inverse, $C^{-1}$, into the multiplicative inverse of element A further includes multiplying the multiplicative inverse, $C^{-1}$, by the conversion factor.

5. An encoding apparatus containing means for computing the quotient, B/A, of two elements of Galois Field $GF(2^{2M})$, said apparatus comprising:
   A. means for converting the divisor, A, into an element C of $GF(2^{2M})$, where C is $A^T$ and T equals $w^M + 1$, the element C being also an element of a smaller Galois Field $GF(2^M)$ which is a sub-field of $GF(2^{2M})$;
   B. means for finding the multiplicative inverse, $C^{-1}$, of the element C in the smaller Galois Field $GF(2^M)$;
   C. means for converting the multiplicative inverse, $C^{-1}$, into an element of $GF(2^{2M})$ which is the multiplicative inverse, $A^{-1}$, of A by multiplying $C^{-1}$ by $A^R$ where R equals $2^M$; and
   D. means for multiplying the element B by the multiplicative inverse $A^{-1}$.

6. The apparatus recited in claim 5 wherein said means for calculating C comprises:
   A. means for calculating a conversion factor of the form $A^R$; and
   B. means for multiplying said conversion factor by the element A.

7. A decoding apparatus containing means for computing the quotient, B/A, of two elements of Galois Field $GF(2^{QM})$, said apparatus comprising:
   A. means for converting the divisor, A, into an element C of $GF(2^{QM})$, where C is $A^P$ and P equals $2^{(Q-1)M} + 2^{(Q-2)M} + \ldots + 2^M + 1$, the element C being also an element of a smaller Galois Field $GF(2^M)$ which is a sub-field of $GF(2^{QM})$;
   B. means for finding the multiplicative inverse, $C^{-1}$, of the element C in the smaller Galois Field $GF(2^M)$;
   C. means for converting the multiplicative inverse, $C^{-1}$, into an element of $GF(2^{QM})$ which is the multiplicative inverse, $A^{-1}$, of A by multiplying $C^{-1}$ by $A^S$ where S equals $2^{(Q-1)M} + 2^{(Q-2)M} + \ldots + 2^M$; and
   D. means for multiplying the element B by the multiplicative inverse $A^{-1}$.

8. The apparatus recited in claim 7 wherein said means for calculating C comprises:
   A. means for calculating a conversion factor of the form $A^S$; and
   B. means for multiplying said conversion factor by the element A.

9. The apparatus recited in claim 7 wherein said means for finding the multiplicative inverse, $C^{-1}$, further includes the use of a look-up table consisting of all elements of $GF(2^M)$.

10. The apparatus of claim 7 wherein said means for converting the multiplicative inverse, $C^{-1}$, into the multiplicative inverse of element A further includes multiplying the multiplicative inverse, $C^{-1}$, by the conversion factor.

11. A decoding apparatus containing means for computing the quotient, B/A, of two elements of Galois Field $GF(2^{2M})$, said apparatus comprising:
   A. means for converting the divisor, A, into an element C of $GF(2^{2M})$, where C is $A^T$ and T equals $w^M + 1$, the element C being also an element of a smaller Galois Field $GF(2^M)$ which is a sub-field of $GF(2^{2M})$;
   B. means for finding the multiplicative inverse, $C^{-1}$, of the element C in the smaller Galois Field $GF(2^M)$;
   C. means for converting the multiplicative inverse, $C^{-1}$, into an element of $GF(2^{2M})$ which is the multiplicative inverse, $A^{-1}$, of A by multiplying $C^{-1}$ by $A^R$ where R equals $2^M$; and
   D. means for multiplying the elements B by the multiplicative inverse $A^{-1}$.

12. The apparatus recited in claim 11 wherein said means for calculating C comprises:
   A. means for calculating a conversion factor of the form $A^R$; and
   B. means for multiplying said conversion factor by the element A.

* * * * *